United States Patent
Hashi (10) Patent No.: US 8,107,252 B2
(45) Date of Patent: Jan. 31, 2012

(54) MOUNTING STRUCTURE OF ELECTRONIC COMPONENT AND METHOD OF MANUFACTURING ELECTRONIC COMPONENT

(75) Inventor: Yukihiro Hashi, Shiojiri (JP)

(73) Assignee: Seiko Epson Corporation (JP)

( * ) Notice: Subject to any disclaimer, the term of this patent is extended or adjusted under 35 U.S.C. 154(b) by 320 days.

(21) Appl. No.: 12/561,287

(22) Filed: Sep. 17, 2009

(65) Prior Publication Data

US 2010/0079962 A1 Apr. 1, 2010

(30) Foreign Application Priority Data

Sep. 26, 2008 (JP) .................... 2008-247495

(51) Int. Cl.
*H05K 7/00* (2006.01)
(52) U.S. Cl. ........ 361/760; 361/767; 361/768; 361/752; 331/73
(58) Field of Classification Search .......... 361/760, 361/752, 768, 767; 333/193–198, 219; 310/311, 310/323.06, 327; 331/339, 73, 68, 155; 427/100; 29/25.35, 830, 832–846
See application file for complete search history.

(56) References Cited

U.S. PATENT DOCUMENTS

| 5,867,074 | A | 2/1999 | Ogiso et al. | |
|---|---|---|---|---|
| 7,254,876 | B2 * | 8/2007 | Ikegami | 29/25.35 |
| 7,495,927 | B2 * | 2/2009 | Furihata et al. | 361/760 |
| 7,534,337 | B2 * | 5/2009 | Hasei | 205/118 |
| 7,570,149 | B2 * | 8/2009 | Kondo | 338/20 |
| 2002/0149298 | A1 * | 10/2002 | Furukawa et al. | 310/340 |
| 2003/0062969 | A1 * | 4/2003 | Inoue | 333/193 |
| 2004/0257175 | A1 * | 12/2004 | Hidaka et al. | 333/204 |
| 2007/0013458 | A1 * | 1/2007 | Itou et al. | 333/133 |

FOREIGN PATENT DOCUMENTS

| JP | 11-261360 | 9/1999 |
|---|---|---|
| JP | 2003-163563 | 6/2003 |
| JP | 2007-013444 | 1/2007 |
| JP | 2008-091691 | 4/2008 |
| WO | 95-24075 | 9/1995 |

* cited by examiner

*Primary Examiner* — Hoa C Nguyen
(74) *Attorney, Agent, or Firm* — Harness, Dickey & Pierce, P.L.C.

(57) ABSTRACT

A mounting structure includes: an electronic component including: a functional element having a predetermined function; a first resin protrusion section having a surface covered by a covering film including a conductive section electrically connected to the functional element; and a second resin protrusion section that is disposed inside an area surrounded by the first resin protrusion section, and has adhesiveness at least on a surface of the second resin protrusion section, and a base member having a connection electrode and adapted to mount the electronic component. In the structure, the second resin protrusion section mounts the electronic component on the base member in a condition in which the conductive section of the covering film has conductive contact with the connection electrode due to elastic deformation of the first resin protrusion section.

8 Claims, 5 Drawing Sheets

MOUNTING STRUCTURE OF ELECTRONIC COMPONENT AND METHOD OF MANUFACTURING ELECTRONIC COMPONENT

BACKGROUND

1. Technical Field

The present invention relates to a mounting structure of an electronic component, and a method of manufacturing an electronic component.

2. Related Art

An electronic component such as a quartz crystal resonator including a functional element is fixed in the state in which excitation electrodes provided to the quartz crystal resonator and connection electrodes for connecting the quartz crystal resonator to a drive circuit have conductive contact with each other via a conductive paste such as a solder paste (see, e.g., JP-A-11-261360). In the case of using such a conductive paste, the connecting section between the quartz crystal resonator and each of the connection electrodes might be damaged when an impact such as a drop impact is applied thereto, which is a factor for degrading connection reliability.

Therefore, it is possible to adopt a mounting structure of an electronic component in which a bump electrode composed of a core section having elasticity and a conductive film disposed on the surface of the core section is provided to the excitation electrode, and the bump electrode and the connection electrode have conductive contact with each other via an adhesive. However, in the case of adopting such a bump electrode, outgas generated from the adhesive might change the vibration characteristic of the quartz crystal resonator, thereby degrading the reliability.

SUMMARY

An advantage of the invention is to provide a mounting structure of an electronic component and a method of manufacturing an electronic component capable of preventing degradation of electronic component characteristic by preventing influence of the outgas.

According to a first aspect of the invention, a mounting structure includes: an electronic component including: a functional element having a predetermined function; a first resin protrusion section having a surface covered by a covering film including a conductive section electrically connected to the functional element; and a second resin protrusion section that is disposed inside an area surrounded by the first resin protrusion section, and has adhesiveness at least on a surface of the second resin protrusion section, and a base member having a connection electrode and adapted to mount the electronic component. In the structure, the second resin protrusion section mounts the electronic component on the base member in a condition in which the conductive section of the covering film has conductive contact with the connection electrode due to elastic deformation of the first resin protrusion section.

According to the mounting structure of an electronic component of the first aspect of the invention, there can be obtained a structure in which the first resin protrusion section covered by the covering film is used as the electrical contact and the second resin protrusion section is made to function as the bonding material, thereby mounting the electronic component on the base member while keeping the preferable conducting state. Here, since the first resin protrusion section is covered by the covering film, the influence of the outgas generated from the resin can be prevented. Further, since the second resin protrusion section is surrounded by the first resin protrusion section in the periphery thereof, thereby being put into the sealed condition. Thus, the influence of the outgas generated from the second resin protrusion section can be prevented. Therefore, degradation of the characteristic of the electronic component due to the outgas can be prevented. Further, since both of the first and second resin protrusion sections have elasticity, the load to the conducting section can be reduced even in the case in which an external impact is applied, thus superior conducting reliability can be obtained.

Further, in the mounting structure of an electronic component of the first aspect of the invention, it is preferable that the functional element be a quartz crystal element.

In the first aspect of the invention, the electronic component configures the quartz crystal resonator provided with the quartz crystal element. Therefore, the deterioration of the vibration characteristic of the quartz crystal resonator due to the outgas can be prevented as described above, and the quartz crystal resonator provided with high conducting reliability can be obtained.

Further, in the mounting structure of an electronic component of the above aspect of the invention, it is preferable that the first resin protrusion section and the second resin protrusion section be made of a same photosensitive resin material.

According to this configuration, it becomes possible to simultaneously form the first and second resin protrusion sections using, for example, a photolithographic process. Therefore, the manufacturing process of the electronic component can be simplified, and the manufacturing cost can be reduced.

Further, in the mounting structure of an electronic component of the first aspect of the invention, it is preferable that a height of the second resin protrusion section be smaller than a height of the first resin protrusion section.

According to this configuration, the first resin protrusion section is deformed elastically to make the conducting section and the connection electrode adhere tightly to each other, thereby putting the second resin protrusion section into the sealed condition in a reliable manner.

Further, in the mounting structure of an electronic component of the first aspect of the invention, it is preferable that the second resin protrusion section have a cross-sectional shape having a width smaller than a width of a cross-sectional shape of the first resin protrusion section.

In the case in which, for example, the first and second resin protrusion sections are formed by applying a liquid resin material using a spin coat process, patterning it, and then melting the resin, by setting the width of the protrusion section in the cross-sectional shape to be relatively large, the height of the protrusion section can be formed to have a relatively large height. Therefore, the second resin protrusion section described above can be formed to have a height smaller than the height of the first resin protrusion section.

Further, in the mounting structure of an electronic component of the first aspect of the invention, it is preferable that the covering film be formed of an electrode layer provided to the functional element.

According to this configuration, the covering film can be formed together with the electrode layer in the manufacturing process of the electronic component, thus the manufacturing process can be simplified.

According to a second aspect of the invention, there is provided a method of manufacturing an electronic component that is mounted on a base member having a connection electrode, and includes: a functional element having a predetermined function; a first resin protrusion section formed on the functional element; a second resin protrusion section that is formed inside an area surrounded by the first resin protrusion section, made of a same material as a material of the first resin protrusion section, and has a bonding function; and a covering film including a conductive section electrically connected to the functional element and covers a surface of the first resin protrusion section. The method includes a step for applying a resin material having a function of a bonding material on the functional element; a step for forming a first resin pattern to configure the first resin protrusion section, and a second resin pattern, inside an area surrounded by the first resin pattern, to have a width smaller than a width of the first resin pattern to configure the second resin protrusion section by patterning the resin material; a step for forming the second resin protrusion section to have a height smaller than a height of the first resin protrusion section by melting the first resin pattern and the second resin pattern; and a step for forming the covering film to cover the first resin protrusion section.

When mounting the electronic component obtained by the manufacturing method according to the second aspect of the invention on the base member, the influence of the outgas can be prevented by the first resin protrusion section with the surface covered by the covering film and the fact that it is surrounded by the first resin protrusion section in the periphery. Since the electronic component has the second resin protrusion section surrounded by the first resin protrusion section in the periphery thereof, the second resin protrusion section can reliably be put into the sealed condition by elastically deforming the first resin protrusion section, thus the influence of the outgas generated from the second resin protrusion section can reliably be prevented. As described above, the electronic component with the degradation of the characteristic due to the outgas prevented can be manufactured.

Further, in the method of manufacturing an electronic component of the second aspect of the invention, it is preferable that the step of forming, on the functional element, an electrode layer to be electrically connected to the functional element be further provided, and the covering film is formed of a part of the electrode layer.

According to this configuration, the covering film can be formed together with the electrode layer, thus the manufacturing process of the electronic component can be simplified.

BRIEF DESCRIPTION OF THE DRAWINGS

The invention will now be described with reference to the accompanying drawings, wherein like numbers reference like elements.

DESCRIPTION OF AN EXEMPLARY EMBODIMENT

An embodiment of the invention will hereinafter be explained with reference to the drawings. It should be noted that the scale size of each member is accordingly altered so that the member is shown large enough to be recognized in the drawings used in the following explanations.

Figure 1:
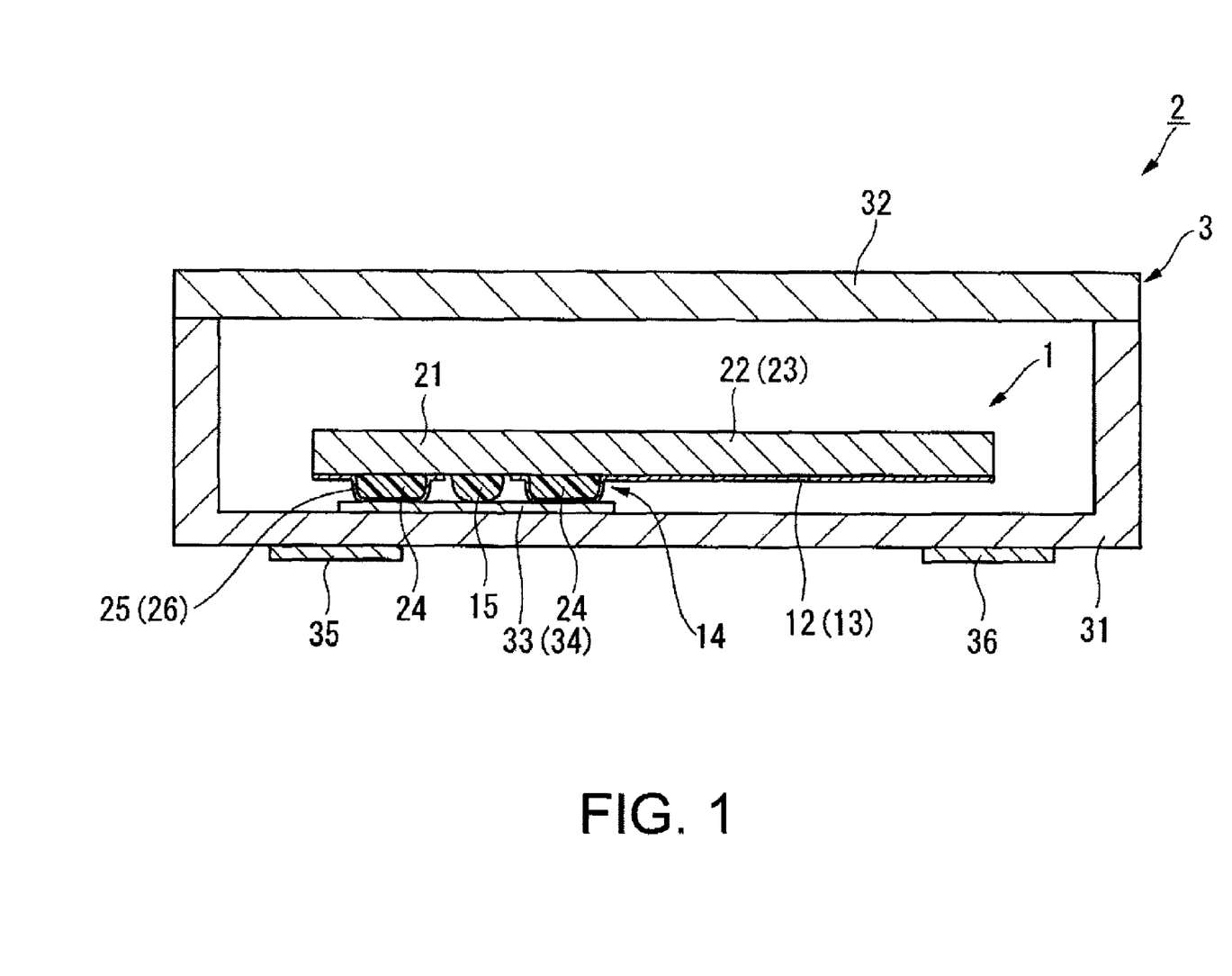
FIG. 1 is a diagram showing a cross-sectional configuration of a quartz crystal resonator package.
Figure 2:
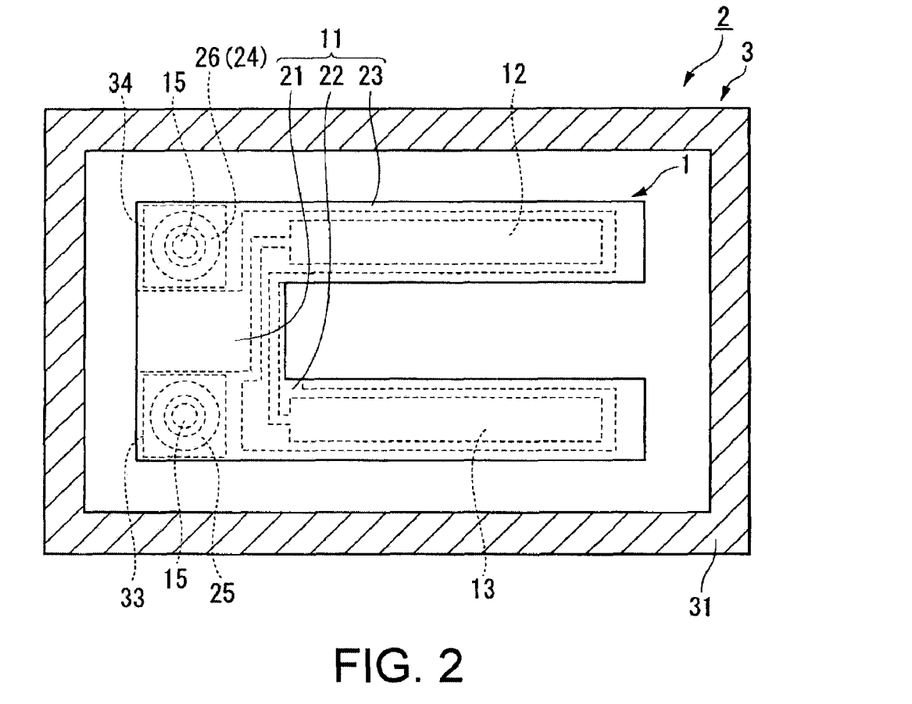
FIG. 2 is a plan view of the quartz crystal resonator package shown in FIG. 1.
Figure 3:
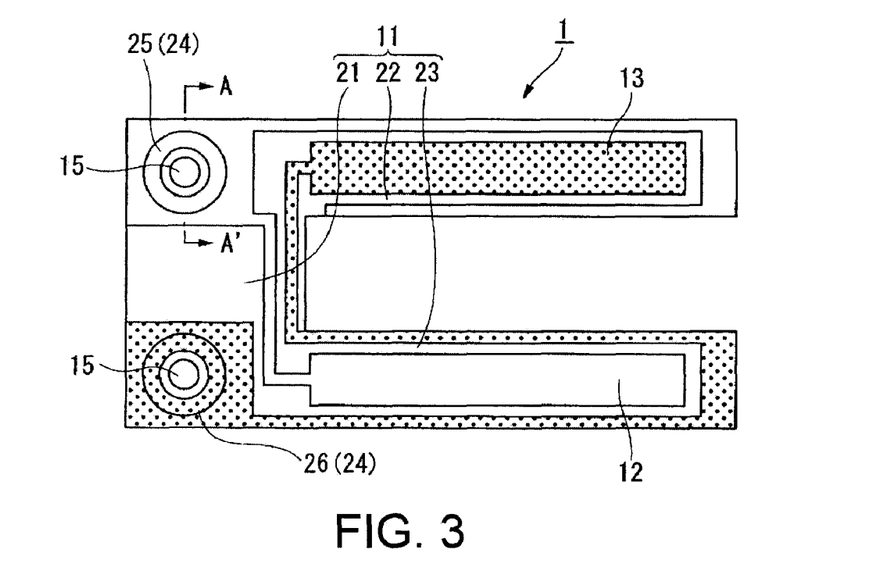
FIG. 3 is a bottom view of the quartz crystal resonator.
Figure 4A:
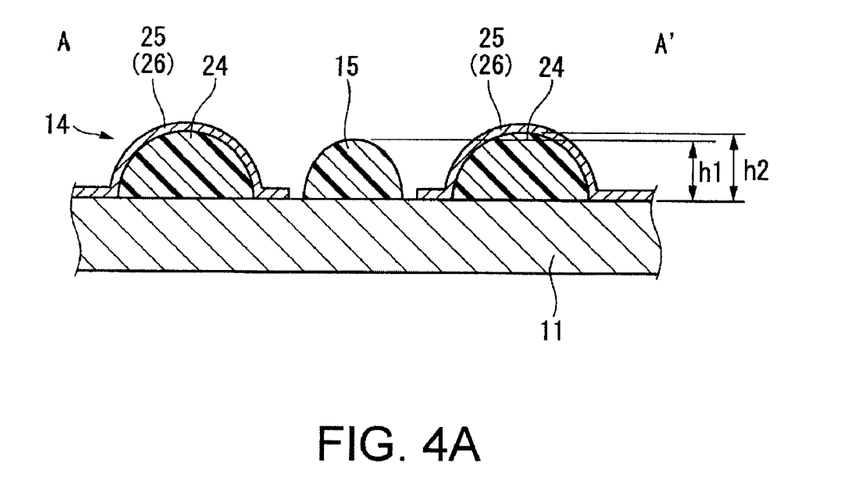
FIGS. 4A and 4B are diagrams each showing a cross-sectional configuration along the A-A' arrowed line shown in FIG. 3.
Figure 4B:
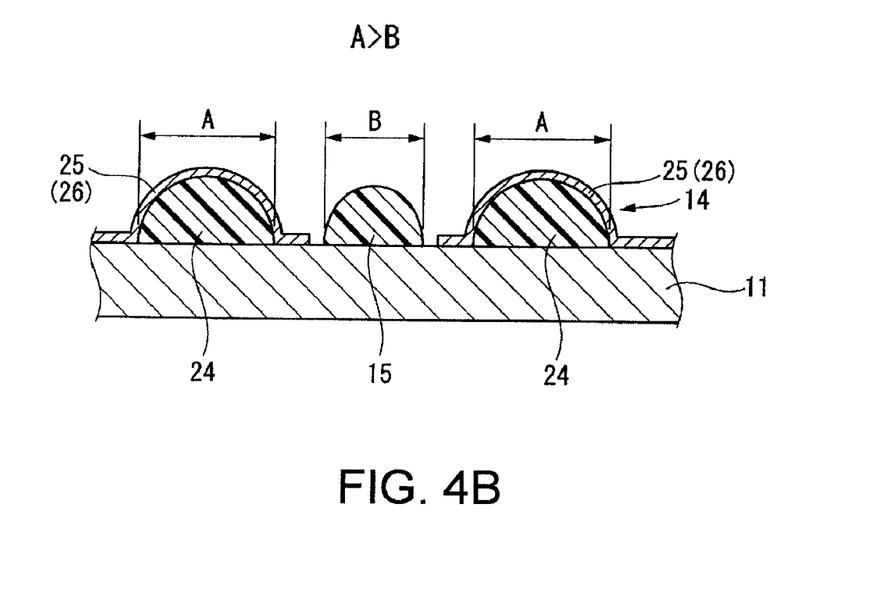

FIG. 1 is a diagram showing a quartz crystal resonator package adopting a mounting structure of an electronic component according to the present embodiment of the invention. FIG. 1 is a diagram showing a cross-sectional configuration of the quartz crystal resonator package, FIG. 2 is a plan view corresponding to FIG. 1, and FIG. 3 is a bottom view of the quartz crystal resonator. Further, FIGS. 4A and 4B are cross-sectional configuration diagrams corresponding to the view along the A-A' line shown in FIG. 3, and are diagrams for explaining a shape of a resin protrusion.

The quartz crystal resonator package (the mounting structure of an electronic component) 2 is provided with a quartz crystal resonator (an electronic component) 1, and a container (a base member) 3 for encapsulating the quartz crystal resonator 1. The quartz crystal resonator 1 is provided with a quartz crystal element (a functional element) 11, a pair of excitation electrodes 12, 13, bump electrodes 14, and bonding sections 15 as shown in FIGS. 1 through 3.

The container 3 is provided with connection electrodes 33, 34 used for electrical connection to the quartz crystal resonator 1 as described later in detail, and terminal electrodes 35, 36 used when being mounted on a circuit board (not shown) or the like.

The quartz crystal element 11 is a plate like member having a substantially U shape in plan view, and a planar shape like a tuning fork having two arm sections 22, 23 extending in parallel to each other in the same directions from a base section 21.

Each of the pair of excitation electrodes 12, 13 is formed of a conductive material such as aluminum (Al) or gold (Au) on one surface of the quartz crystal element 11. Further, the excitation electrode 12 is formed on the one surface of the quartz crystal element 11 so as to extend from the base section 21 to the arm section 22. Further, the excitation electrode 13 is formed on the one surface of the quartz crystal element 11 so as to extend from the base section 21 to the arm section 23.

The bump electrode 14 is formed on one surface of the base section 21 in the condition of being electrically connected to the excitation electrodes 12, 13 described above. The bump electrode 14 is provided with resin core sections (first resin protrusion sections) 24 each shaped like a protrusion, and a pair of conductive films (covering films) 25, 26 formed respectively on the surfaces of the resin core sections 24 as shown in FIGS. 1 and 3.

The conductive films 25, 26 are formed by patterning films formed by, for example, a sputtering process. In the present embodiment, the conductive films 25, 26 are formed continuously to the excitation electrodes 12, 13 by patterning an Au/Cr layer formed by a sputtering process, and therefore, are provided with electrical conduction to the excitation electrodes 12, 13, respectively. In other words, the quartz crystal resonator package 2 uses the bump electrodes 14 as the electrical contacts between the quartz crystal resonator 1 and the container 3.

It should be noted that the conductive films 25, 26 can be made of metal or an alloy such as gold (Au), titanium tungsten (TiW), copper (Cu), chromium (Cr), nickel (Ni), titanium (Ti), tungsten (W), nickel vanadium (NiV), aluminum (Al), palladium (Pd), or a lead-free solder, and formed of a single layer or multiple layers of any of these materials.

As shown in FIG. 2, the resin core sections 24 are each configured to have a substantially annulus ring shape in the plan view, and the conductive films 25, 26 covering the resin cores 24 are each formed to have an annulus shape. Further, the resin core sections 24 are each formed to have a substantially semicircular cross-sectional shape by patterning a resin material by a photolithographic process or an etching process as described later and then melting the resin pattern.

Since the resin core sections 24 are covered by the conductive films 25, 26 as described above, various kinds of resin materials can be used as the resin core sections 24, and the resin core sections 24 are made of photosensitive insulating resin or thermoset insulating resin such as polyimide resin, acrylic resin, phenol resin, silicone resin, silicone-modified polyimide resin, or epoxy resin (epoxy resin is used in the present embodiment).

Further, inside an area of the one surface of the base section 21 surrounded by the resin core section 24 (the bump electrode 14), there is disposed the bonding section (a second resin protrusion section) 15 shaped like a protrusion. As shown in FIG. 1, the bonding sections 15 are arranged so that the resin core sections 24 forming the bump electrodes 14 deform elastically along the surface shapes of the connection electrodes 33, 34 described later, respectively, thus the quartz crystal resonator 1 can be mounted of the container main body 31 in the condition in which the conductive films 25, 26 have conductive contact with the connection electrodes 33, 34, respectively. The quartz crystal resonator 1 has a cantilever structure in which the base section 21 is supported by the container 3 as shown in FIG. 1.

As the bonding section 15, various kinds of materials can be used providing the materials have adhesiveness at least on the surfaces thereof, and specifically in the present embodiment, the bonding section 15 is made of the same material (epoxy resin) as that of the resin core section 24 described above. By thus forming the resin core section 24 and the bonding section 15 from the same material, the photolithographic process and the etching process can be executed in the same conditions, thus the manufacturing process can be simplified. It should be noted that the bonding section 15 can also be configured by separately forming an adhesive layer having adhesiveness on the surface of resin, which does not function as a bonding material.

As shown in FIG. 4A, the height h1 of the bonding section 15 is set to be lower than the height h2 of the resin core section 24. Thus, the resin core sections 24 are deformed elastically as described above thereby making the conductive films 25, 26 and the connection electrodes 33, 34 adhere tightly to each other, respectively, and thus the bonding section 15 can reliably be put into a sealed condition.

Further, as shown in FIG. 4B, the width B of the bonding section 15 in the cross-sectional shape is set to be smaller than the width A of the resin core section 24 in the cross-sectional shape. By designing the width B of the bonding section 15 to be small as described above, the shape having the height h1 of the bonding section 15 lower than the height h2 of the resin core section 24 can easily be obtained in the manufacturing process described later.

The container 3 described above is provided with the container main body 31 and a lid member 32 for covering the container main body 31.

The container main body 31 is formed to have a substantially box-like shape, and is formed of an insulating material such as ceramics. Further, on the upper surface of the bottom section of the container main body 31, there are formed the connection electrodes 33, 34. Further, on the lower surface of the bottom section of the container main body 31, there are formed the terminal electrodes 35, 36 used when it is mounted on a circuit board (not shown).

The connection electrodes 33, 34 are each formed by stacking a layer of an Au film on a plated layer of Ni formed on a W film, and connected respectively to the terminal electrodes 35, 36 via the wiring (not shown) formed on the container main body 31.

Similarly to the container main body 31, the lid member 32 is made of an insulating material such as ceramics. Further, the lid member 32 is bonded to the opening section of the container main body 31 by, for example, brazing, thereby encapsulating the quartz crystal resonator 1 inside the space formed between the lid member 32 and the container main body 31.

As described above, the quartz crystal resonator package 2 according to the present embodiment uses the bump electrodes 14 as the electrical contacts, thereby making it possible to mount the quartz crystal resonator 1 on the container 3 while keeping the preferable conducting state by the bonding sections 15. Since the resin core sections 24 are covered respectively by the conductive films 25, 26, the problem that the outgas generated from the resin core sections 24 deteriorates the vibration characteristic of the quartz crystal resonator 1 (the quartz crystal element 11) can be prevented. Further, since the resin core sections 24 are elastically deformed along the surface shapes of the connection electrodes 33, 34 as shown in FIG. 1, the bonding sections 15 become in the state of adhering tightly to the conductive films 25, 26, respectively. In other words, the bonding section 15 is put into the sealed state by being surrounded by the bump electrode 14 in the periphery thereof. Thus, the problem that the outgas generated from the bonding section 15 deteriorates the vibration characteristic of the quartz crystal resonator 1 (the quartz crystal element 11) can be prevented.

As described above, according to the quartz crystal resonator package 2 according to the present embodiment, the deterioration of the characteristic of the quartz crystal resonator 1 (the electronic component) due to the outgas generated from the resin material can be prevented, thereby providing the component with high reliability. Further, since the resin core sections 24 and the bonding sections 15 are both provided with elasticity, the load to the conducting section between the bump electrodes 14 and the connection electrodes 33, 34 can be reduced even in the case in which an external impact is applied thereto, thus superior conduction reliability can be obtained. Further, since the bump electrodes can be manufactured using the photolithographic process, downsizing of the electrode can be achieved compared to the conductive paste of the related art.

As an embodiment of an aspect of the invention related to a method of manufacturing an electronic component, a process of manufacturing the quartz crystal resonator package 2 (the quartz crystal resonator 1) described above will be explained. In the present embodiment, there are characterizing features in the processes of forming the bump electrodes 14 and the bonding sections 15 described above. Therefore, the explanations will hereinafter be presented with a focus on the method of manufacturing the bump electrodes 14 and the bonding sections 15.

Figure 5A:
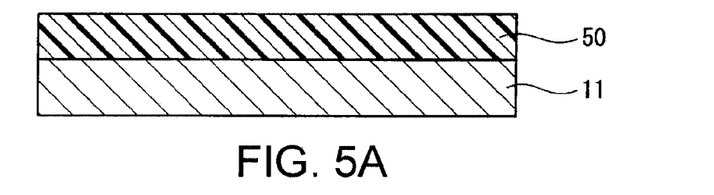
FIGS. 5A through 5D are diagrams showing a process of forming bump electrode and a bonding section.

Firstly, as shown in FIG. 5A, a photosensitive resin material 50 is applied on one surface of the quartz crystal element 11 by a spin coat method. Specifically, in the present embodiment, epoxy resin having a function as the bonding material in the bonding process described later is applied.

Figure 5B:
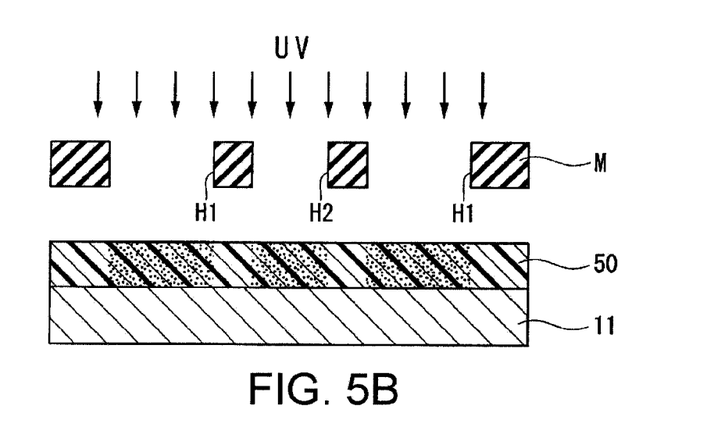

Subsequently, exposure and development process is executed. Specifically, as shown in FIG. 5B, a photomask M provided with openings corresponding to a first resin pattern P1 forming the resin core sections 24 described above and a second resin pattern P2 forming the bonding sections 15 described above is used. The photomask M is arranged to have a width of a first opening section H1 corresponding to the first resin pattern P1 larger than the width of an opening section H2 corresponding to the second resin pattern P2. It should be noted that the second opening section H2 is disposed inside the area surrounded by the first opening section H1.

Figure 5C:
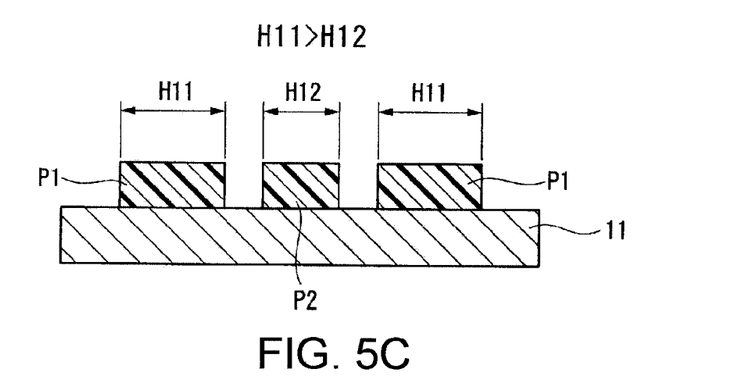

By executing the exposure process and the development process using such a photomask M, the first resin pattern P1 and the second resin pattern P2 are formed on the quartz crystal element 11 as shown in FIG. 5C. The width H11 of the first resin pattern P1 in the cross-sectional shape is arranged to be larger than the width H12 of the second resin pattern P2 in the cross-sectional shape.

As described above, in the present embodiment, by forming the first and second resin patterns P1, P2 from the same photosensitive resin material, it becomes possible to form the first and second resin patterns P1, P2 in the same photolithographic process. Thus, it becomes possible to achieve simplification of the manufacturing process. Further, since the first and second resin patterns P1, P2 are formed using the photolithographic process, a fine pattern can be formed.

Figure 5D:
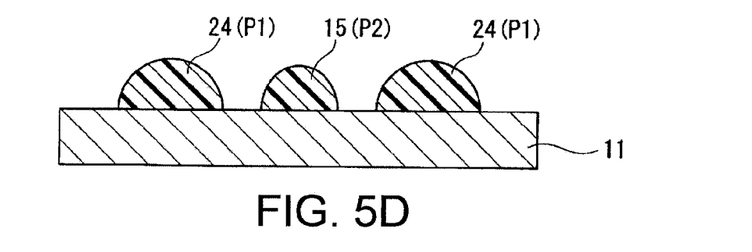

Subsequently, as shown in FIG. 5D, by heating the first and second resin patterns P1, P2, the first and second resin patterns P1, P2 are melted, thereby forming the resin core sections 24 and the bonding sections 15 having the semicircular shapes. As the heating method, various methods can be cited, and in the present embodiment, the heating process is performed by putting the quartz crystal resonator 1 in a heating oven, for example.

In this case, as the first and second resin patterns P1, P2 are melted, the height of the second resin pattern P2 with the smaller width H12 becomes smaller than that of the first resin pattern P1 with the larger width H11. Thus, the resin core sections 24 and the bonding sections 15 with the height smaller than that of the resin core section 24 are formed on the quartz crystal element 11.

After forming the resin core sections 24 and the bonding sections 15 in the manner as described above, the excitation electrodes 12, 13 are formed on the quartz crystal element 11. The excitation electrodes 12, 13 are formed by depositing the Au/Cr layer using, for example, a sputtering process, and then patterning the Au/Cr layer to form a desired pattern. Specifically, the Au/Cr layer is patterned so as to form a covering state of the resin core sections 24 and to expose the bonding sections 15. Thus, the excitation electrodes 12, 13 and the conductive films 25, 26 covering the resin core sections 24 can be formed. As described above, in the present embodiment, the conductive films 25, 26 are formed with parts of the excitation electrodes 12, 13, respectively, thus the manufacturing process can be simplified.

Through the process described above, the quartz crystal resonator 1 provided with the resin core sections 24 and the bonding sections 15 at the connection sections of the excitation electrodes 12, 13 can be manufactured.

Then, a method of mounting the quartz crystal resonator 1 will be explained with reference to FIGS. 6A and 6B. Here, FIGS. 6A and 6B are cross-sectional views showing the bump electrode 14 when mounting the quartz crystal resonator 1 on the container 3.

Figure 6A:
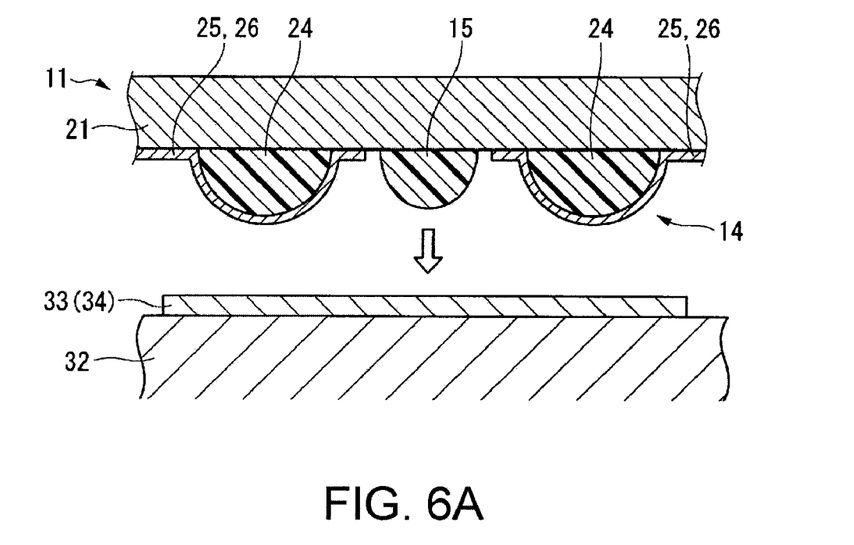
FIGS. 6A and 6B are diagrams for explaining a method of mounting the quartz crystal resonator.
Figure 6B:
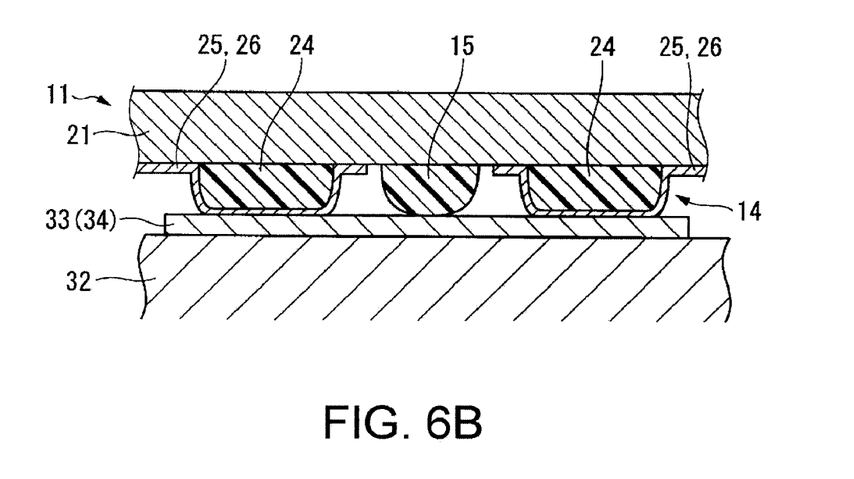

Firstly, the bump electrodes 14 and the bonding sections 15 provided to the quartz crystal resonator 1 are contacted and pressed against the connection electrodes 33, 34 provided to the container main body 31 (see FIGS. 6A and 6B). It should be noted that the mounting process of the quartz crystal resonator 1 is executed in a heated condition.

In this case, the resin core sections 24 are deformed elastically along the shape of the connection electrodes 33, 34, respectively.

Then, the conductive film 25 is deformed along the surface shape of the connection electrode 33 in association with the elastic deformation of the resin core section 24, and at the same time, the conductive film 26 is deformed along the surface shape of the connection electrode 34. Thus, conductive contact with sufficient contact area is obtained between the conductive film 25 and the connection electrode 33, and between the conductive film 26 and the connection electrode 34. Further, the bonding sections 15 with the height smaller than that of the resin core section 24 come in contact with the connection electrodes 33, 34, respectively. Then the bonding sections 15 are cured.

Therefore, the bonding sections 15 can bond the bump electrodes 14 and the respective connection electrodes 33, 34 due to the elastic deformation of the resin core sections 24, thereby keeping the contact condition between the conductive film 25 and the connection electrode 33, and between the conductive film 26 and the connection electrode 34.

In the manner as described above, the quartz crystal resonator 1 is mounted inside the container main body 31. Subsequently, the container main body 31 and the lid section 32 are bonded to each other, thereby encapsulating the quartz crystal resonator 1. The quartz crystal resonator package 2 is formed in the manner as described above.

In this case, since the resin core sections 24 are covered respectively by the conductive films 25, 26, it can be prevented that the outgas generated from the resin core sections 24 deteriorates the vibration characteristic of the quartz crystal resonator 1 (the quartz crystal element 11). Further, the bonding sections 15 are surrounded by the respective bump electrodes 14 in the periphery thereof so as to be kept in the sealed condition as shown in FIG. 6B, and therefore, it can be prevented that the outgas generated from the bonding section 15 deteriorates the vibration characteristic of the quartz crystal resonator 1 (the quartz crystal element 11).

According to the quartz crystal resonator package 2 thus formed, the deterioration of the characteristic of the quartz crystal resonator 1 due to the outgas generated from the resin material is prevented, thereby obtaining high reliability.

Further, in the case in which, for example, an impact such as a drop impact is applied to the correction section between the quartz crystal resonator 1 and the container main body 31, the resin core sections 24 is deformed elastically to absorb the impact.

It should be noted that the invention is not limited to the embodiment described above, but various modifications can be executed thereon within the scope or the spirit of the invention.

For example, although in the embodiment, the configuration of providing a single bonding section 15 inside the bump electrode 14 having the annulus ring shape in the plan view is adopted, it is also possible to provide a plurality of bonding sections 15, thereby improving the bonding strength of the quartz crystal resonator to the container main body 31. Further, although in the present embodiment, it is assumed that the bonding section 15 has a circular shape in the plan view, the bonding section 15 can be formed to have a vaulted shape. The vaulted shape means a columnar shape having a planar inner surface (bottom surface) having contact with the quartz crystal element 11, and a curved outer surface not having contact therewith. Specifically, as the substantially vaulted shape, the shapes with lateral cross-sectional shapes of a substantially semicircular shape, a substantially semielliptical shape, and a substantially trapezoidal shape can be cited.

The entire disclosure of Japanese Patent Application No. 2008-247495, filed Sep. 28, 2008 is expressly incorporated by reference herein.

What is claimed is:

1. A mounting structure comprising:
an electronic component, the electronic component including:
a functional element having a predetermined function;
a first resin protrusion section having a surface covered by a covering film including a conductive section electrically connected to the functional element; and
a second resin protrusion section that is disposed inside an area surrounded by the first resin protrusion section, and has adhesiveness at least on a surface of the second resin protrusion section, and
a base member having a connection electrode and adapted to mount the electronic component,
wherein the second resin protrusion section mounts the electronic component on the base member in a condition in which the conductive section of the covering film has conductive contact with the connection electrode due to elastic deformation of the first resin protrusion section.

2. The mounting structure according to claim 1, wherein the functional element is a quartz crystal element.

3. The mounting structure according to claim 1, wherein the first resin protrusion section and the second resin protrusion section are made of a same photosensitive resin material.

4. The mounting structure according to claim 1, wherein a height of the second resin protrusion section is smaller than a height of the first resin protrusion section.

5. The mounting structure according to claim 4, wherein the second resin protrusion section has a cross-sectional shape having a width smaller than a width of a cross-sectional shape of the first resin protrusion section.

6. The mounting structure according to claim 1, wherein the covering film is formed of an electrode layer provided to the functional element.

7. A method of manufacturing an electronic component that is mounted on a base member having a connection electrode, and includes: a functional element having a predetermined function; a first resin protrusion section formed on the functional element; a second resin protrusion section that is formed inside an area surrounded by the first resin protrusion section, made of a same material as the first resin protrusion section is made with, and has a bonding function; and a covering film including a conductive section electrically connected to the functional element and covers a surface of the first resin protrusion section, the method comprising:
applying a resin material having a function of a bonding material on the functional element;
forming a first resin pattern to configure the first resin protrusion section, and a second resin pattern, inside an area surrounded by the first resin pattern, to have a width smaller than a width of the first resin pattern to configure the second resin protrusion section by patterning the resin material;
forming the second resin protrusion section to have a height smaller than a height of the first resin protrusion section by melting the first resin pattern and the second resin pattern; and
forming the covering film to cover the first resin protrusion section.

8. The method of manufacturing an electronic component according to claim 7, further comprising forming, on the functional element, an electrode layer to be electrically connected to the functional element, wherein the covering film is formed of a part of the electrode layer.

* * * * *